US005254900A

United States Patent [19]

Magori et al.

[11] Patent Number: 5,254,900

[45] Date of Patent: Oct. 19, 1993

[54] BROAD BEAM ULTRASONIC TRANSDUCER

[75] Inventors: Valentin Magori, Müchen; Thomas Möckl, Coburg, both of Fed. Rep. of Germany

[73] Assignee: Siemens Aktiengesellschaft, Munich, Fed. Rep. of Germany

[21] Appl. No.: 778,817

[22] PCT Filed: Jun. 22, 1990

[86] PCT No.: PCT/DE90/00478

§ 371 Date: Dec. 18, 1991

§ 102(e) Date: Dec. 18, 1991

[87] PCT Pub. No.: WO91/00153

PCT Pub. Date: Jan. 10, 1991

[30] Foreign Application Priority Data

Jun. 23, 1989 [DE] Fed. Rep. of Germany ....... 3920663

[51] Int. Cl.$^5$ .............................................. H01L 41/08

[52] U.S. Cl. ...................................... 310/334; 310/322

[58] Field of Search ................. 310/322, 334; 367/152

[56] References Cited

U.S. PATENT DOCUMENTS 2,814,575 11/1957 Lange, Jr. .......................... 310/334

2,901,644 8/1959 Tibbetts et al. ..................... 310/312

3,674,945 7/1972 Hands ................................. 310/334

4,166,967 9/1979 Benes et al. ......................... 310/338

4,360,562 11/1982 Endo et al. .......................... 310/327

4,523,122 6/1985 Tone et al. .......................... 310/334

4,656,384 4/1987 Magori ............................... 310/334

4,677,337 6/1987 Kleinschmidt et al. ............ 310/334

4,756,808 7/1988 Utsumi et al. ...................... 310/334

4,771,205 9/1988 Mequio .............................. 310/334

FOREIGN PATENT DOCUMENTS 0154706 9/1985 European Pat. Off. .

0182140 5/1986 European Pat. Off. .

2537788 3/1977 Fed. Rep. of Germany .

*Primary Examiner*—Steven L. Stephan

*Assistant Examiner*—C. LaBalle

*Attorney, Agent, or Firm*—Hill, Steadman & Simpson

[57] ABSTRACT

Disclosed is a broad beam ultrasonic transducer of sandwich construction, having piezoceramic laminae (2), fitted with electrodes, and plates/films (3, 13) in the shape of a parallelepiped with a width (B) to length (L) ratio of 0.42 and in which the relative thicknesses of the piezoceramic laminae and the plates/films are chosen such that one side surface of the parallelepiped undergoes an in-phase oscillation behavior.

10 Claims, 1 Drawing Sheet

BROAD BEAM ULTRASONIC TRANSDUCER

BACKGROUND OF THE INVENTION

The present invention relates to a broad beam ultrasonic transducer.

U.S. Pat. No. 4,677,377 discloses a piezoelectric transducer which is intended to be used as an emitting transducer or as a receiving transducer for ultrasonic waves propagating in air. The use of the transducer disclosed by this publication has solved substantial problems which are associated with the extreme difference between the acoustic wave impedance of the sound-transmitting medium of air and the acoustic wave impedance of a solid body emitting or receiving the ultrasonic waves. This acoustic wave impedance is also referred to as the acoustic characteristic impedance.

The ultrasonic transducer of the aforementioned publication has an acoustic characteristic impedance which in relative terms is substantially closer to the value thereof of air. This is achieved by a sandwich construction which consists of individual mutually spaced piezoelectric laminae disposed in planes parallel to one another, the intermediate spaces, corresponding to the spacings, between these laminae being filled with an inherently stable material which has a low acoustic characteristic impedance value. The material occupying the intermediate spaces forms at least one closed surface of this electroacoustic transducer enclosing the piezoelectric laminae, namely a surface for the emission and/or for the reception of acoustic radiation. In this case, for example, this material occupying the intermediate spaces may extend beyond at least a respective one of the edge surfaces of the individual laminae, so that these edge surfaces of the laminae are covered in relation to the external environment by this material occupying the intermediate spaces.

Such a known transducer may be designed so that this surface of the same which is provided for emission and/or reception has relatively large dimensions as compared with the wavelength, in air, of the emitted or received acoustic radiation. If the individual piezoelectric laminae are excited to execute co-phase oscillation, then, originating from this surface of the transducer, an acoustic wave with a substantially plane phase front is emitted.

The material employed for the laminae is piezoelectric ceramic, e.g. lead zirconate titanate, lead titanate, barium titanate and the like, it being possible for these materials to include dopings and/or substitutions, of, inter alia, manganese, niobium, neodymium etc. to improve their respective properties. The material intended to occupy the intermediate spaces between the laminae is, in this known transducer, for example a thermoplastic material. By way of example, the entire body consisting of this material and the piezoelectric laminae is adhesively bonded together while hot. However, the intermediate spaces in this body may also be filled with a sealing compound consisting of silicon rubber.

With regard to further details with respect to the structural configuration and the production of such a known transducer, reference is made to the aforementioned publication.

SUMMARY OF THE INVENTION

The object of the present invention is to provide an electroacoustic transducer with favorable matching of the acoustic characteristic impedance to the medium of air, which transducer has as its acoustic radiation lobe one which has a relatively small width in the x coordinate direction perpendicular to the direction z of the axis of the acoustic radiation, i.e. a small beam width, and which has a broad beam in the coordinate direction y which is respectively perpendicular to this direction x and to the axial direction z, i.e. possesses a broad beam width in this direction. The structural configuration of the transducer to be provided is intended to be such that, proceeding from a basic type, individual types with beam widths in the y direction which differ from one another in a predeterminable manner can be obtained by the selection of individual dimensions. In particular, it is intended that the broad beam width can be selectable within the range from 50° to 100° (−6 dB) for the individual type of transducer.

This object is achieved with a transducer having a transducer body in the form of a parallelepiped with the length (L), the width (B) and the thickness (D) and one surface of the transducer body as a sound-emitting and-/or sound-receiving surface (5). The transducer body has on one hand at least one lamina provided with electrodes and which consists of piezoelectric material and, on the other hand, at least two plates/films consisting of a plastic material. These laminae and plate/films are alternately connected to one another in succession in the direction of the thickness of the parallelepiped. The ratio of the width to the length of the parallelepiped is at least approximately 0.42. The long lateral surface (thickness×length) of the parallelepiped is the sound-emitting and/or sound-receiving surface. The plastic material is a material having a mechanical oscillation quality factor in the order of magnitude of that of the piezoelectric material of the laminae. This plastic material has a lower acoustic characteristic impedance than that of the piezoelectric material of the laminae, and the Poisson ratio of the plastic material is less than 0.3.

In the transducer the thickness ratio $d_p:d_k$, with $d_p$ for the components of the plates/films consisting of the plastic material and with $d_k$ for the components of the lamina consisting of the piezoelectric material, is selected so that the particle velocity of the transducer is at least approximately half as great as that of the piezoelectric material under the same excitation conditions, preferably equal voltage, in the case of resonance. The particle velocity is the velocity with which the particles (for example, air molecules) move back and forth. The plastic material of the plates/films can be a formed glass or a coarse-pored sintered glass. The sound-emitting or sound-receiving surface of the transducer body can be a closed film region consisting of the plastic material.

Highly directional transducers including, for example, the transducers disclosed in references DE-A-2,537,788 and GB-A-1,530,347, have an beam width of 5° to 10° (−6 dB). A transducer according to the invention having a beam width of, for example, 70° in the direction designated above by y and with a highly directional effect in the x direction is an extremely broad beam ultrasonic transducer. In a plane which is respectively perpendicular to the axial direction z, the cross section of the acoustic lobe of such a transducer according to the invention is relatively flat in the x direction, but on the other hand wide in the y direction, and represents, overall, a surface which, at least to an approximation, is similar to an ellipse. With increasing spacing $(z-z_0)$ from the surface Zo of the transducer, this cross sectional surface area becomes progressively greater, but without losing its characteristic form of a transducer having a broad beam in a lateral direction y.

In order to achieve the object specified above, an attempt had been made to develop further the transducer disclosed in U.S. Pat. No. 4,677,337. However, it became evident that the specific object of the present invention could not be achieved in this manner. Difficulties arose, for example, if the thickness of the plastic occupying the intermediate spaces is substantially greater than the thickness of the piezoelectric laminae. In pulsed operation, the excitation of the laminae no longer led to co-phase surface deformation, on account of the low acoustic wave velocity in the y direction, but permitted interfering surface ripple to take place. In the case of resonant excitation of a pulsed transducer with the natural oscillation which is necessarily associated therewith, the gain in efficiency proved to be relatively limited. In a design and dimensions based on the object of high achieving mechanical losses, i.e. a low oscillation quality factor, the load capacity of the transducer was relatively severely limited on account of the generation of heat. The use of the above-mentioned silicon rubber or of a material comparable thereto, such materials having relatively large transverse contraction, produced excessively severe mode coupling with thickness resonances of the film transducer made using sandwich construction, specifically as soon as the stack height exceeds a specified value. In the case of pulse transducers, this is of advantage per se, since a multimode pulse transducer necessarily has a broad band. However, in the case of a single-frequency transducer, mode coupling is in most cases associated with an impairment of the electromechanical coupling factor and thus of the electroacoustic efficiency. In the case of transducers operated using a single frequency, as intended or required for the invention, a very comprehensive check of the occurrence of natural modes of the piezoelectric laminae contained in the transducer is essential with respect to the frequency, the form of the oscillation and the electromechanical coupling factor k, specifically for the purpose of achieving a defined directional characteristic and optimum efficiency. In order to achieve the object according to the invention, it would accordingly be necessary to embark upon a fundamentally new path, even though a transducer according to the invention in general again consists of rectangular piezoelectric laminae and composite material.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
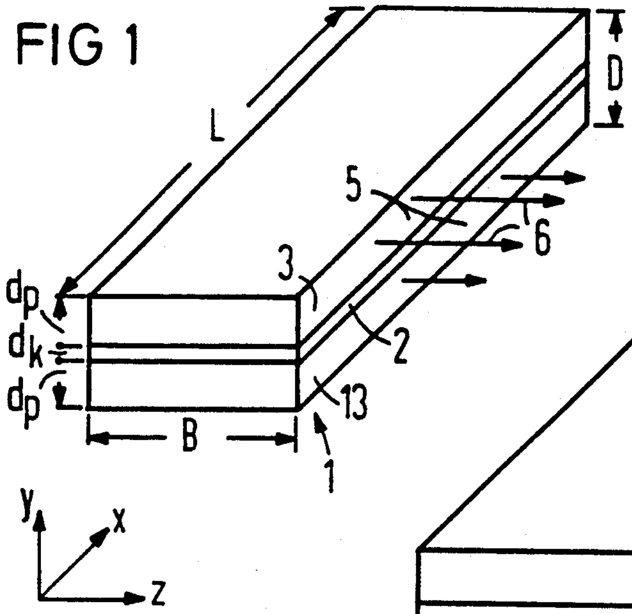
FIG. 1 shows the principle of a transducer according to the invention.

FIG. 1 shows the principle of a transducer 1, designed according to the invention, and the relative dimensions of which are selected according to the invention. In the embodiment shown in FIG. 1, this transducer 1 consists of a piezoelectric ceramic lamina 2 provided with electrodes (not shown in the figure) and of films or plates 3, 13 consisting of a plastic material. The length of the represented rectangular composite body of the transducer 1 is designated by L. Its width is designated by B. Its overall thickness is designated by D, and this is the sum of the thickness dimensions $d_p$ of the plates 3, 13 and the thickness dimension $d_k$ of the lamina 2.

That surface of the transducer 1 which is designated by 5 is the emitting or sound-receiving surface which is provided or selected in accordance with the invention. The emission provided according to the invention is indicated by the arrows 6.

The ceramic lamina 2 and the films or plates 3, 13 are firmly connected to one another over their surfaces, as shown. In the case of thermoplastic material, the bonding agent (adhesive) may be the material of the films or plates 3, 13 itself.

A transducer according to the invention may also consist of a plurality of ceramic laminae and a corresponding number of films or plates.

For the sake of completeness, reference is made to the IEEE publication, Transactions on Sonics and Ultrasonics, Vol. SU 15 (1968) pp. 97/105, where numerous forms of resonant oscillation are indicated for a rectangular piezoelectric plate, but only for a single active plate alone.

The material of the plates 3, 13 on both sides of the piezoelectric lamina 2 is selected with regard to low acoustic characteristic impedance Z and with regard to the smallest possible Poisson ration $\mu$ less than 0.3 and with regard to the highest possible oscillation quality factor Q greater than 20. A low acoustic characteristic impedance is used to achieve the best possible matching to the sound transmission medium of air. A small Poisson ratio contributes to the avoidance, as far as possible, of the excitation of transverse modes. In fact, these may already occur in circumstances in which the thickness D is even smaller than the width B of the transducer 1. A high quality factor Q of this material permits the achievement of oscillatory deflection in the material of the plates 3, 13, which approximates to and preferably exceeds the oscillatory deflection of the ceramic lamina 2. An example of such a material is that material which is described in reference DE-C-2,537,788 and in reference GB-A-1,530,347, and which is an epoxy resin filled with glass or silicon dioxide hollow spheres, also known under the trademark Scotch-Ply. Another material is polystyrene, a "glass foam", a sintered glass or the like. Where in this instance the material of the plates/films 3, 13 . . . is designated as plastic material, the mineral substance "glass" in forms as indicated is also included within the meaning of the invention.

According to the invention, the ratio of the two dimensions B and L indicated in FIG. 1 is dimensioned as:

$$B:L \text{ at least approximately} = 0.42.$$

Using this specified dimensioning, according to the invention a mode of oscillation of the transducer 1 is ensured in which the surface 5 oscillates as far as possible approximately in-phase i.e. executes a "piston oscillation", and specifically with a coupling factor which is high at the same time.

Figure 2:
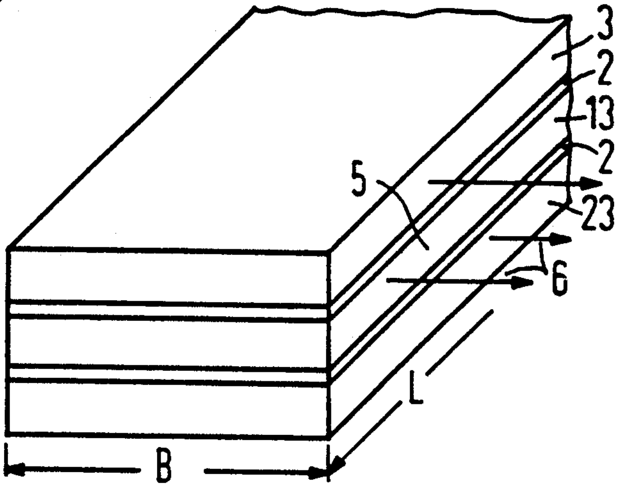
FIGS. 2 and 3 show specific embodiments.

FIG. 2 shows an embodiment according to the invention with two ceramic laminae 2 and with 3 plates, 3, 13, 23.

Figure 3:
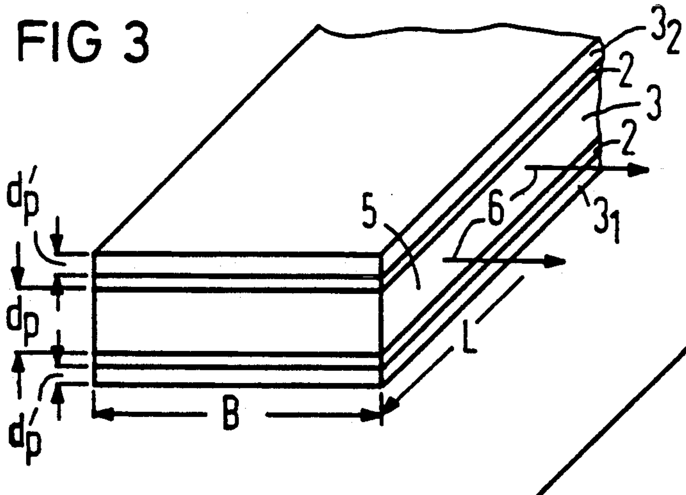

FIG. 3 shows an embodiment, likewise according to the invention, with two ceramic laminae 2, one plate 3 and two coatings $3_1$ and $3_2$, which are considerably thinner as compared with the thickness of the plate 3 and which are situated on the outwardly pointing surfaces of the ceramic laminae 2.

Preferably, an embodiment according to FIG. 1 is selected if the quality factor Qp of the material of the plates 3, 13 . . . is smaller than the quality less factor $Q_k$ of the piezoceramic of the laminae 2. If $Q_p$ is approximately equal to $Q_k$, the selection of a transducer according to FIG. 1 is recommended. If $Q_p$ is greater then $Q_k$, an embodiment according to FIG. 3 is expediently selected, and specifically with $\frac{1}{2}$ $d_p$ greater than $d_p$, greater than 1/5 $d_p$. For the purpose of the respective selection, the decisive matter is the specified objective of ensuring an amplitude decreasing towards the edge regions with an as far as possible (transversely to the laminae) inphase oscillation behavior of the emitting surface 5; this gives rise to a directional behavior which has few sidelobes.

Figure 4:
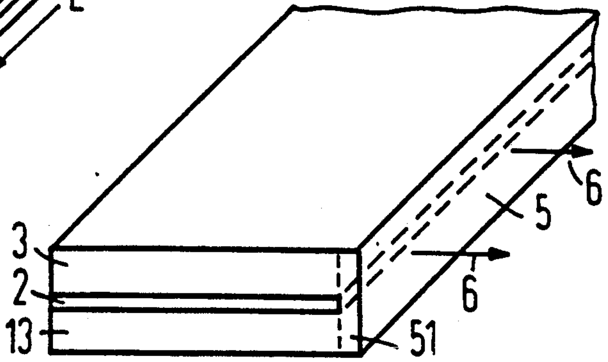
FIG. 4 shows an embodiment with a plastic material covering the entire surface.

In the case of all embodiments, the plastic material can also cover the entire surface 5, as shown by FIG. 4 with the film region 51.

Optimum acoustic effectiveness for a mode of oscillation arises for a transducer according to the invention if the thickness ratio $d_p$:$d_k$ is selected to be optimum. Other modes which have an interfering effect are avoided by complying to the above specification, namely that the plastic material is so selected or is present in such a form (e.g. foam) that its Poisson ratio is less than 0.3. An optimum $d_p$:$d_k$ ratio is applicable if the transducer thus dimensioned has, in the case of resonant excitation, an amplitude of oscillation or particle velocity which is half as great as is applicable in the case of a transducer (having the same external dimensions) which however consists purely of the piezoelectric material or is not such a composite transducer. In these circumstances, the oscillation energy is apportioned by halves to the two material components of the individual transducer.

The invention is not limited to the particular details of the apparatus depicted and other modifications and applications are comtemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An electroacoustic film transducer comprising:

a transducer body in the form of a parallelepiped with a length, a width and a thickness and one surface of the transducer body being a sound-emitting and/or sound-receiving surface, the transducer body having at least one lamina provided with electrodes, the lamina consisting of piezoelectric material, and at least two plates/films consisting of a plastic material, and the laminae and plates/films being connected to one another alternately in succession in a direction of the thickness, the ratio of the width to the length of the parallelepiped having approximately the value 0.42, a long lateral surface, defined by the thickness×length dimensions of the parallelepiped, being the sound-emitting and/or sound receiving surface, and the plastic material being a material having a mechanical oscillation quality factor in the order of magnitude of that of the piezoelectric material of the laminae, the plastic material having a lower acoustic characteristic impedance than that of the piezoelectric material of the laminae, and a Poisson ration of the plastic material being smaller than 0.3.

2. The transducer as claimed in claim 1, wherein a thickness ration $d_p$:$d_k$, with $d_p$ for components of the at least two plastic/films consisting of the plastic material and with $d_k$ for components of the at least one lamina consisting of the piezoelectric material, is selected so that the particle velocity of the transducer is at least approximately half as great as that of another transducer consisting solely of piezoelectric material under the same excitation conditions, preferably equal voltage, in the case of resonance for the transducer having both plastic material and piezoelectric material and for the transducer consisting solely of piezoelectric material.

3. The transducer as claimed in claim 1, wherein the plastic material of the plates/films is a foamed glass.

4. The transducer as claimed in claim 1, wherein the plastic material of the plates/films is a coarse-pored sintered glass.

5. The transducer as claimed in claim 1, wherein the surface that is the sound-emitting and/or sound-receiving surface of the transducer body is a surface of a closed film region, consisting of the plastic material.

6. An electroacoustic film transducer comprising:

a transducer body in the form of a parallelepiped with a length, a width and a thickness and one surface of the transducer body being a sound-emitting and/or sound-receiving surface, the transducer body having at least one lamina provided with electrodes, the lamina consisting of piezoelectric material, and at least two plates/films consisting of a plastic material, and the laminae and plates/films being connected to one another alternately in succession in a direction of the thickness, said thickness of the parallelepiped being a sum of thicknesses of the laminae and plates/films and each of the laminae and plates/films having a width and length equal respectively to the width and length of the parallelepiped.

the ratio of the width to the length of the parallelepiped having approximately the value 0.42, a long lateral surface, defined by the thickness×length dimensions of the parallelepiped, being the sound-emitting and/or sound receiving surface, and the plastic material being a material having a mechanical oscillation quality factor in the order of magnitude of that of the piezoelectric material of the laminae, the plastic material having a lower acoustic characteristic impedance than that of the piezoeletric material of the laminae, and a Poisson ratio of the plastic material being smaller than 0.3.

7. The transducer as claimed in claim 6, wherein a thickness ratio $d_p$:$d_k$, with $d_p$ for components of the at least two plastic/films consisting of the plastic material and with $d_k$ for components of the at least one lamina consisting of the piezoelectric material, is selected so that the particle velocity of the transducer is at least approximately half as great as that of another transducer consisting solely of piezoelectric material under the same excitation conditions, preferably equal voltage, in the case of resonance for the transducer having both plastic material and piezoelectric material and for the transducer consisting solely of piezoelectric material.

8. The transducer as claimed in claim 6, wherein the plastic material of the plates/films is a foamed glass.

9. The transducer as claimed in claim 6, wherein the plastic material of the plates/films is a coarse-pored sintered glass.

10. The transducer as claimed in claim 6, wherein the surface that is the sound-emitting and/or sound-receiving surface of the transducer body is a surface of a closed film region, consisting of the plastic material.

* * * * *